(12) United States Patent
Bavois et al.

(10) Patent No.: US 11,942,778 B2
(45) Date of Patent: Mar. 26, 2024

(54) METHOD FOR SUPPLYING AN INDUCTIVE LOAD

(71) Applicant: VITESCO TECHNOLOGIES GMBH, Hanover (DE)

(72) Inventors: Thierry Bavois, Toulouse (FR); Florence Capy, Toulouse (FR)

(73) Assignee: VITESCO TECHNOLOGIES GMBH, Hanover (DE)

(*) Notice: Subject to any disclaimer, the term of this patent is extended or adjusted under 35 U.S.C. 154(b) by 386 days.

(21) Appl. No.: 17/288,489

(22) PCT Filed: Oct. 25, 2019

(86) PCT No.: PCT/EP2019/079216
§ 371 (c)(1),
(2) Date: Apr. 23, 2021

(87) PCT Pub. No.: WO2020/084128
PCT Pub. Date: Apr. 30, 2020

(65) Prior Publication Data
US 2021/0391707 A1 Dec. 16, 2021

(30) Foreign Application Priority Data
Oct. 26, 2018 (FR) ...................... 1859927

(51) Int. Cl.
*H02H 3/16* (2006.01)
*H02H 1/00* (2006.01)
(Continued)

(52) U.S. Cl.
CPC ............. *H02H 7/0838* (2013.01); *H02P 7/04* (2016.02); *H02P 29/028* (2013.01)

(58) Field of Classification Search
CPC ................................... H02H 3/16; H02H 3/05
See application file for complete search history.

(56) References Cited

U.S. PATENT DOCUMENTS 5,642,247 A * 6/1997 Giordano ............. H02H 7/0838
318/434
10,479,402 B2 11/2019 Pasqualetto
(Continued)

FOREIGN PATENT DOCUMENTS

DE 10 2006 030 594 1/2008
DE 10 2016 220 030 4/2018
(Continued)

OTHER PUBLICATIONS

Oliveira et al., "Digital Short-Circuit Diagnosis and Reconfiguration of a Fault Tolerant VSI," 2017 IEEE Southern Power Electronics Conference (SPEC), IEEE, Dec. 4, 2017, XP033344614, pp. 1-6.
(Continued)

*Primary Examiner* — Kawing Chan
*Assistant Examiner* — Charles S Laughlin
(74) *Attorney, Agent, or Firm* — NIXON & VANDERHYE (57) ABSTRACT

A device for supplying power to an inductive load, including an H-bridge switching structure, the switching structure being designed to drive a current in the inductive load through a first control output and a second control output, an anomaly detector designed to generate an item of anomaly detection information about the detection of an anomaly at the switching structure, the anomaly detector including a first voltage generator, a second voltage generator, a first current measuring device, a second current measuring device designed to measure a current at the output of the second voltage generator, a third current measuring device, a fourth current measuring device, a fifth current measuring device and a sixth current measuring device, the current measuring devices being designed to respectively measure the currents of the switches.

15 Claims, 6 Drawing Sheets

(51) Int. Cl.
  *H02H 7/08* (2006.01)
  *H02P 7/03* (2016.01)
  *H02P 29/028* (2016.01)

(56) References Cited

U.S. PATENT DOCUMENTS

| | | | |
|---|---|---|---|
| 2006/0294425 A1 | 12/2006 | Kollner et al. | |
| 2010/0014196 A1* | 1/2010 | Oku .................... | H02H 7/0844 |
| | | | 361/33 |
| 2013/0083434 A1 | 4/2013 | Barth | |
| 2018/0183364 A1* | 6/2018 | Lee ...................... | H02P 29/027 |
| 2019/0225259 A1 | 7/2019 | Pasqualetto | |

FOREIGN PATENT DOCUMENTS

| | | |
|---|---|---|
| EP | 1 184 256 | 3/2002 |
| FR | 3 056 039 | 3/2018 |
| WO | 2018/050991 | 3/2018 |
| WO | 2018/069074 | 4/2018 |

OTHER PUBLICATIONS

International Search Report for PCT/EP2019/079216 dated Jan. 17, 2020, 7 pages.
Written Opinion of the ISA for PCT/EP2019/079216 dated Jan. 17, 2020, 9 pages.

* cited by examiner

METHOD FOR SUPPLYING AN INDUCTIVE LOAD

CROSS-REFERENCE TO RELATED APPLICATIONS

This application is the U.S. national phase of International Application No. PCT/EP2019/079216 filed Oct. 25, 2019 which designated the U.S. and claims priority to FR 1859927 filed Oct. 26, 2018, the entire contents of each of which are hereby incorporated by reference.

BACKGROUND OF THE INVENTION

Field of the Invention

The present invention relates in general to the supply of power to an inductive load.

It relates more particularly to the detection of an anomaly or anomalies, such as for example an open circuit or else a short circuit that may occur in a switching structure, such as for example a switch bridge used to drive a current in a load. The invention is applicable in particular in the automotive field. It is able to be implemented for example in an electronic circuit incorporating a switching structure, such as a transistor H-bridge.

Description of the Related Art

A motor vehicle contains numerous inductive loads, such as for example electric motors. These electric motors may also be used in electronic actuator control systems. This may be for example an electronic throttle control (ETC) device, or an exhaust gas recirculation (EGR device) valve, or any other valve used in engine control. More generally, it may be any other apparatus actuated by an electric motor, such as a power window for example.

The power supply of such inductive loads generally uses a switching structure, such as an H-bridge of switches. An H-bridge comprises four power switches, namely two "high-side" switches on the side of a positive power supply, for example a battery, and two "low-side" switches on the side of a negative power supply or of an electrical ground of the motor vehicle. Each switch generally comprises a power MOS ("metal-oxide semiconductor") transistor.

To control these switches, a sequence of analog control signals is produced based on a setpoint control signal. The setpoint control signal and the analog control signals are generally pulse-width-modulated signals, or PWM signals. The duty cycle of the PWM signals makes it possible to control the current injected into the inductive load coupled to the switches. Depending on the control strategies, the H-bridge is actuated in given and authorized configurations. Furthermore, other configurations are by contrast prohibited, such as for example a configuration in which a "high-side" switch and a "low-side" switch would be closed simultaneously, creating a short circuit between the battery and electrical ground.

Physical anomalies may occur in the wiring of the switching structure, that is to say of the H-bridge, such as for example an open circuit on one of the outputs of the H-bridge or else a short circuit between an output of the H-bridge and the positive power supply. The occurrence of an anomaly, in a phase of controlling the inductive load, may cause it to malfunction. Furthermore, these anomalies may sometimes cause irreversible damage either to the driven load or to the H-bridge.

In order to prevent the risks linked to degradation of the load or of the H-bridge, there are techniques for detecting open circuit or else short circuit anomalies in such a switching structure. However, these anomaly detection techniques are not easy to implement since they are, inter alia, dependent on the state of the four switches of the H-bridge and also dependent on nearby electronic circuits that are coupled to the outputs of the H-bridge. This dependence results in variable levels of current or voltage to be detected and/or to be applied, leading to complexity in the processing and the strategy for detecting said anomalies.

For example, one technical solution known from the prior art consists in positioning the four switches of the H-bridge in an open state (transistors in the off state) in order to isolate the load, which, as a reminder, is always coupled to the two control output terminals of the H-bridge. This technical solution then proposes to apply a voltage, which is controlled using for example a voltage regulator, to a first control output terminal of the H-bridge (that is coupled to a first terminal of the load). A fixed current is applied to a second control output terminal of the H-bridge (that is coupled to a second terminal of the load), for example using a current generator. The first control output and the second control output of the H-bridge are furthermore coupled to a current comparator that makes it possible to compare the currents flowing at the first control output and the second control output of the H-bridge (therefore through the load). The proposed technical solution thus makes it possible, on the basis of the level of difference between the measured currents, to deduce the presence of a battery short circuit, short circuit to electrical ground or open circuit anomaly.

However, this technical solution exhibits problems in terms of reliability of the diagnosis. Specifically, nearby electronic circuits coupled to the H-bridge may influence the levels of the currents flowing in the load through the first and the second control output of the H-bridge. Thus, when for example an output resistor is coupled to a control output of the H-bridge, or when for example a capacitor is also coupled to one of the control outputs of the H-bridge, it becomes difficult to detect an anomaly. Specifically, it is possible, depending on the levels of the currents and on the sensitivity of the comparator, for a short circuit (or open circuit) anomaly to be detected when it is not proven.

SUMMARY OF THE INVENTION

The invention proposes, in a first aspect, a measuring device and a method that are intended to detect at least one open circuit or short circuit anomaly in an H-bridge structure coupled to an inductive load. The aim of the proposed solution is to improve the reliability of the detection of said detected anomaly in comparison with the identified techniques from the prior art.

To this end, a first aspect of the invention proposes a device for supplying power to an inductive load, comprising:
  an H-bridge switching structure coupled to a positive power supply and to an electrical ground and comprising a first, a second, a third and a fourth switch that are distributed over two branches of the H-bridge, the switching structure being designed to drive a current in the inductive load through a first control terminal and a second control terminal,
  anomaly detection means designed to generate at least one item of anomaly detection information about the detection of an anomaly at the switching structure, wherein the anomaly detection means comprise:

a) a first voltage generator controlled and designed to deliver a first reference voltage Vref1, a second voltage generator controlled and designed to deliver a second reference voltage Vref2, the first voltage generator and the second voltage generator being coupled respectively to the first control output and to the second control output, the value of the first reference voltage Vref1 being greater than the value of the second reference voltage Vref2, b) a first current measuring device designed to measure a current at the output of the first voltage generator; a second current measuring device designed to measure a current at the output of the second voltage generator, c) a third current measuring device coupled between the first switch and the first control output, a fourth current measuring device coupled between the second switch and the first control output, a fifth current measuring device coupled between the third switch and the second control output, a sixth current measuring device coupled between the fourth switch and the second control output, the current measuring devices being designed to respectively measure the currents flowing through said switches, d) a seventh voltage measuring device coupled to the first control output and an eighth voltage measuring device coupled to the second control output, the seventh voltage measuring device and the eighth voltage measuring device being designed to measure voltages on the control outputs.

It is thus possible to measure numerous electrical parameters that make it possible to optimize the diagnosis of the detection of an anomaly at the H-bridge.

In one exemplary embodiment, the anomaly detection means furthermore comprise a first circuit switch coupled between the first voltage generator and the first control output, and a second circuit switch coupled between the second voltage generator and the second control output; the first circuit switch and the second circuit switch being designed, inter alia, to electrically isolate the structure of the H-bridge. For the sake of rapid detection of an anomaly, it is proposed for example for the first current measuring device, the second current measuring device, the third current measuring device, the fourth current measuring device, the fifth current measuring device and the sixth current measuring device to be designed to take instantaneous measurements and measurements of current and voltage variations.

In a second aspect of the invention, what is also proposed is a method for supplying power to an inductive load, comprising the following steps:

e1) positioning the switches of an H-bridge in an off state, e2) verifying and awaiting the off state of all of the switches, e3) sequentially measuring a current flowing through each switch, if there is no current flowing through all of the switches, then moving to step e11), if there is at least one current flowing through at least one switch, awaiting a first determined duration before performing a new measurement of the current flowing through each switch, if there is at least one current in at least one switch, then first of all identifying whether one of the two switches coupled to the positive power supply is being flowed through by said measured current, if one of said two switches is being flowed through by said current, moving to step e8), if neither of said two switches is being flowed through by a current, then identifying whether one of the two switches coupled to electrical ground is being flowed through by said measured current, if one of said two switches is being flowed through by said current, moving to step e10), e8) confirming the presence of a short circuit to a voltage level higher than the battery anomaly at at least one of the two high-side switches, e10) confirming the presence of a short circuit to a voltage level lower than ground anomaly at at least one of the two low-side switches, e11) detecting the presence of an electromotive force between the first control output and the second control output by measuring the voltages on the first control output and the second control output; if the measured voltages are equal, moving to step e12), if the measured voltages are different, then recording the difference between the first control output and the second control output corresponding to the electromotive force for controlling the connected load, step e13) furthermore comprises a step of awaiting a second determined duration before a new step of measuring the voltages on the first control output and on the second control output; if the measured voltages have equal values, then moving to step e12), otherwise implementing an alert, for example an electromotive force problem error, and stopping the execution of the method, e12) coupling a first voltage generator and a second voltage generator to said control outputs, and then respectively applying a first voltage and a second voltage, e14) measuring the voltages on the first control output and on the second control output, if the measured voltage variations over time are outside a first measurement range, moving to step e16), if they are within the first measurement range, moving to step e20), e16) awaiting a third determined time before measuring the voltages on the first control output and on the second control output again, if the measured voltage variations are again outside the first measurement range, then declaring a frequency interference anomaly, if the measured voltage variations are within the first measurement range, moving to step e20), e20) measuring the currents flowing through the first control output and the second control output, if the difference between the two measured currents is within a second measurement range, then stopping the anomaly test and declaring no short circuit or open circuit anomaly, if not, then moving to step e23), e23) measuring the voltages of the two outputs; if the voltage measured on the first control output is different from the voltage measured on the second control output, then the detected anomaly is an open load anomaly, and stopping the execution of the method, otherwise moving to step e25), e25) measuring the voltages on the first control output and on the second control output, if the measured voltages are greater than the voltages generated by the voltage generators connected to the outputs, then generating an alert regarding the presence of a short circuit to the positive voltage anomaly, if the measured voltages are lower than the voltages generated by the voltage generators connected to the outputs, then generating an alert regarding the presence of a short circuit to electrical ground anomaly.

It is proposed for example for the first determined duration to be equal to 1 ms.

In one variant embodiment, the second determined duration is equal to 100 ms.

Furthermore, for example, the first measurement range is of the order of 2% of the absolute value of the voltage measured on the first control output.

Finally, for example, the second measurement range is of the order of 2% of the absolute value of the current flowing through the inductive load.

BRIEF DESCRIPTION OF THE DRAWINGS

Further features and advantages of the invention will become more clearly apparent from reading the following description. This description is purely illustrative and should be read with reference to the appended drawings, in which.

DESCRIPTION OF THE PREFERRED EMBODIMENTS

Figure 1:
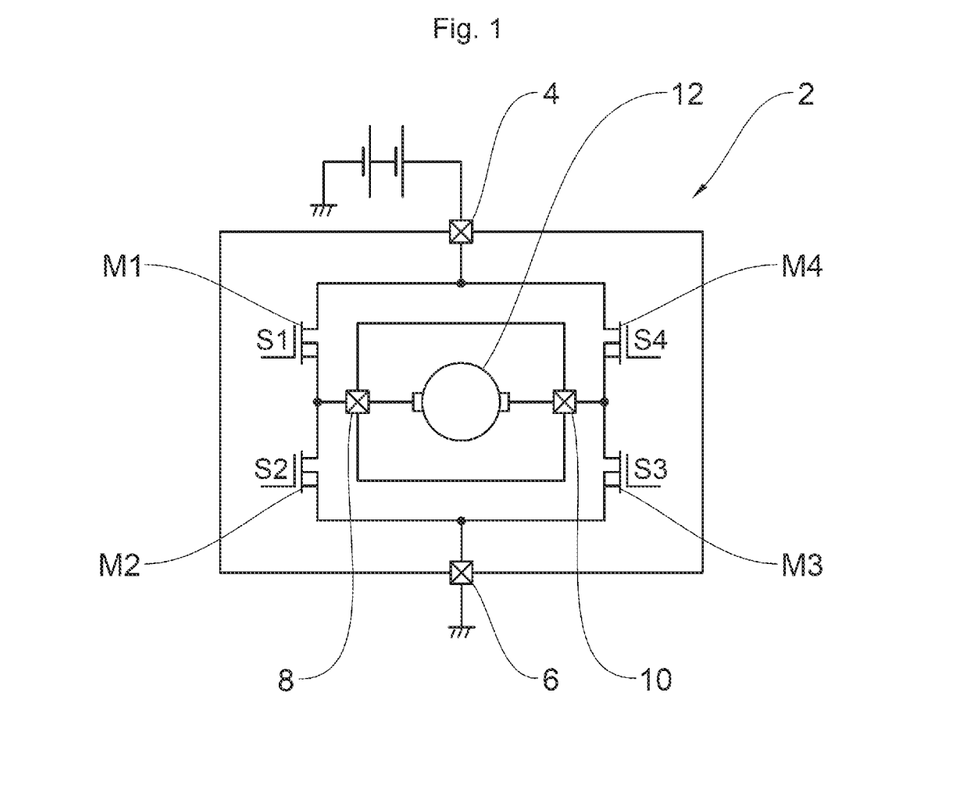
FIG. 1 is a circuit diagram of one example of a switching structure comprising an H-bridge.

FIG. 1 shows a structure of a conventional H-bridge 2, which comprises, inter alia, four power switches each formed for example of a power MOS ("metal-oxide semiconductor") transistor. The H-bridge 2 is coupled to a positive power supply via a first terminal 4 and to a negative power supply via a second terminal 6. The positive power supply may be a battery of a motor vehicle delivering a voltage +Vbat, and the negative power supply may be an electrical ground of the battery and/or of the motor vehicle. The H-bridge 2 furthermore comprises a first control output 8 and a second control output 10. An inductive load 12 is coupled between the first control output 8 and the second control output 10. The inductive load 12 is an electric motor, for example.

The H-bridge 2 also comprises a first transistor M1 coupled between the first terminal 4 and the first control output 8; a second transistor M2 coupled between the second terminal 6 and the first control output 8; a third transistor M3 coupled between the second terminal 6 and the second control output 10, and lastly a fourth transistor M4 coupled between the first terminal 4 and the second control output 10. The first transistor M1 and the fourth transistor M4 may also be called high-side transistors. The second transistor M2 and the third transistor M3 may also be called low-side transistors.

To control the inductive load 12, a first analog signal S1, a second analog signal S2, a third analog signal S3 and lastly a fourth analog signal S4 are applied to the transistors M1 to M4, respectively. The H-bridge 2, through the state of the transistors M1 to M4, thus controls the inductive load 12. The analog signals S1 to S4 originate from a control signal (not shown in FIG. 1) having a variable duty cycle, or also called initial PWM ("pulse width modulation") signal. The initial PWM signal has a frequency that may reach at least 10 kHz (1 kHz=1000 Hz), thereby giving a period T of around 100 is (1 μs=$10^{-6}$ s) or less.

Figure 2A:
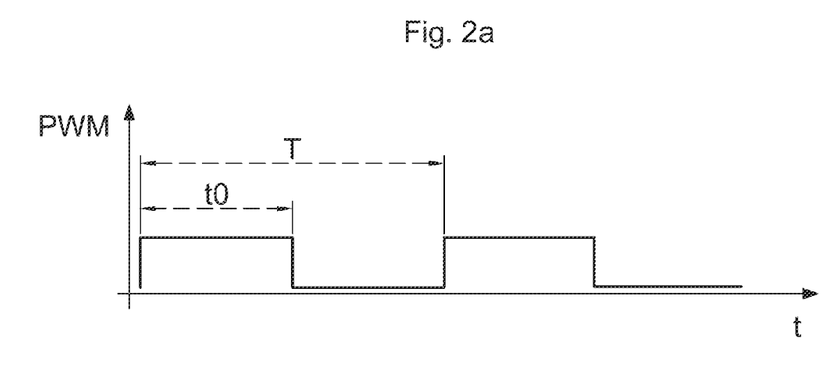
FIGS. 2a and 2b are graphs showing a pulse-width-modulated periodic setpoint control signal, and the corresponding evolution of the current in the controlled inductive load.

As shown in FIG. 2a, such an initial PWM signal is, at each period T, in a given first logic state from among the high and low logic states during a first fraction of the period T, and in another logic state during the rest of the period T. In the example shown in FIG. 2a, the initial PWM signal is in the high logic state for a duration to shorter than the period T, called activation duration. The duty cycle of the initial PWM signal $d_{com}$ is given by:

$$d_{com} = t_0/T \quad (1)$$

The duty cycle of the initial PWM signal $d_{com}$ may vary between 0% and 100%.

Figure 2B:
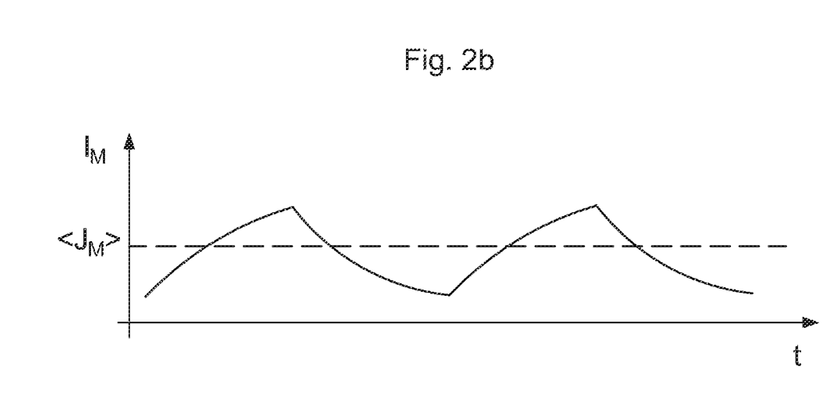

FIG. 2b shows the evolution of the instantaneous value of a current $I_M$ in the inductive load 12, obtained in response to the initial PWM signal of FIG. 2a.

During the activation duration of the initial PWM signal, that is to say, in the example shown here, when this signal is in the high logic state, the current $I_M$ increases in the inductive load 12 toward a given maximum value. This maximum value corresponds to the ratio between the positive supply voltage +Vbat divided by the value of a total resistance. The H-bridge 2 is then controlled in a first or a second state, as will be presented later on.

During the deactivation period of the initial PWM signal, that is to say, in the example, when this signal is in the low logic state, the current $I_M$ decreases toward a zero value. Due to the inductive nature of the inductive load 12, the rises and falls of the current $I_M$ have a shallow slope, rather than following the pattern of the square edges of the initial PWM signal.

The average value $<I_M>$ of the current $I_M$ is then given by:

$$<I_M> = d_{com} \times V\text{bat} \times 1/R \quad (2)$$

where R is essentially the value of the impedance of the inductive load 12. The other resistive elements are values of the resistances, in the on state, of the transistors M1 to M4, called $RDS_{ON}$, and of the resistances of the wires, of the connections and of the tracks of the printed circuit board. Depending on the state of the initial PWM signal and therefore on the state of the analog signals S1 to S4, the H-bridge 2 is preferably able to be controlled in accordance with three possible states or configurations, described below with reference to FIGS. 3a, 3b and 3c.

Figure 3A:
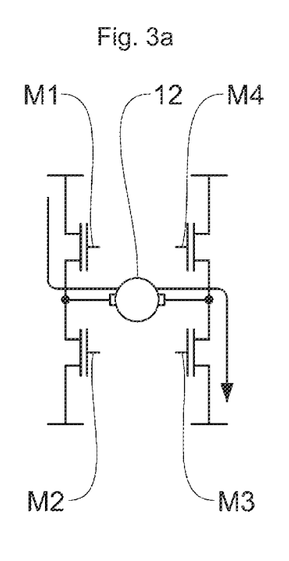
FIGS. 3a, 3b, 3c and 3d are diagrams illustrating configurations for controlling an inductive load using the H-bridge of FIG. 1.

In a first state, the pair formed of the first transistor M1 and of the third transistor M3 makes it possible, when these transistors are in the on state (switches closed), to channel a current through the inductive load 12 in a first direction, from the positive supply voltage +Vbat to electrical ground, as indicated by an arrow in FIG. 3a. The second transistor M2 and the fourth transistor M4 are then in the off state (switches open).

Figure 3B:
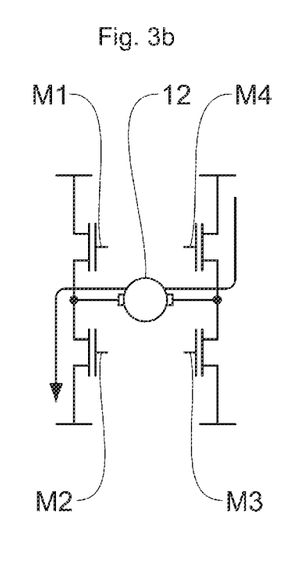

By contrast, in a second state, the pair formed of the second transistor M2 and of the fourth transistor M4 makes it possible, when these transistors are in the on state (switches closed), to channel a current through the inductive load 12 in the other direction, still from the positive power supply +Vbat to electrical ground, as indicated by the arrow in FIG. 3b. The first transistor M1 and the third transistor M3 are then in the off state (switches open).

Figure 3C:
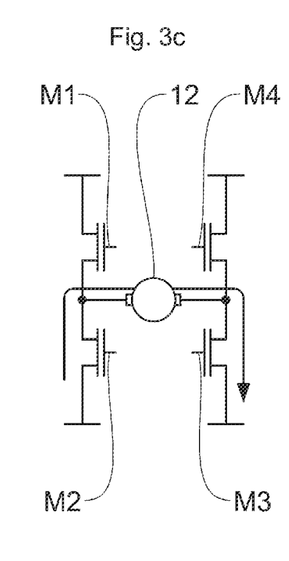

Lastly, in a third state illustrated by FIG. 3c, the first transistor M1 and the fourth transistor M4 are in the off state (switches open) and the second transistor M2 and the third transistor M3 are in the on state (switches closed). This makes it possible to evacuate the power accumulated in the inductive load 12, in the form of a current flowing to electrical ground through the second transistor M2 and the third transistor M3, as shown by the two arrows in FIG. 3c. The direction of the current is then imposed by the inductive load 12. This state is called a "freewheeling" state. It is able to be controlled following operation of the H-bridge 2 in the first state or the second state, mentioned above, after the opening of the first transistor M1 or of the fourth transistor M4, respectively.

Figure 3D:
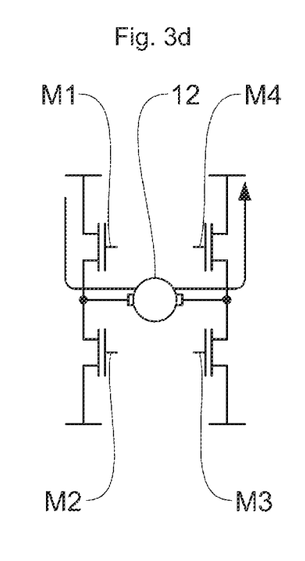

It should be noted that the freewheeling state described above and shown in FIG. 3c may also be produced using other means. Specifically, it is also possible to use structural diodes, making it possible to have a single transistor in the on state. However, the H-bridge 2 may also be put into a fourth state, illustrated by FIG. 3d. In this fourth state, the first transistor M1 and the fourth transistor M4 are in the on state (switches closed) and the second transistor M2 and the third transistor M3 are in the off state (switches open). This makes it possible to evacuate the power accumulated in the inductive load 12, in the form of a current flowing to the positive power supply +Vbat, through the first transistor M1 and the fourth transistor M4, as shown by the two arrows in FIG. 3d. This state is called a "high-side" freewheeling state. It is able to be controlled following operation of the H-bridge 2 in the first state or the second state, mentioned above, after the opening of the second transistor M2 or of the third transistor M3, respectively. The direction of the current is then imposed by the inductive load 12.

By contrast, other configurations of the H-bridge 2 are prohibited, such as for example a configuration in which the first transistor M1 and the second transistor M2 would be in the on state, so as to avoid connecting the positive power supply through the first terminal 4 to electrical ground through the second terminal 6 of the H-bridge 2. Other configurations are also prohibited, and will be presented later on.

It will be appreciated that the invention is not limited to this type of switching structure. In particular, it also applies to a half-bridge switching structure, that is to say with just two power MOS transistors, and after having reconstructed an H-bridge from two half-bridges. Also, the embodiment of the power switch or switches shown in FIGS. 3a, 3b, 3c and 3d is merely a nonlimiting example. These switches may each comprise a type of transistor other than the transistor, such as for example a bipolar junction transistor (BJT) or an insulated-gate bipolar transistor (IGBT) rather than a MOS transistor. They may also comprise an assembly of such transistors, possibly with other components such as resistors, capacitors, etc.

When such an H-bridge 2 is used to control the inductive load 12, physical anomalies external to the structure of the H-bridge 2 may occur at the first control output 8 and the second control output 10, but also at the inductive load 12. These anomalies are in particular short circuits at the first control output 8 and the second control output 10, in particular with possible short circuits:
- between the first control output 8 and electrical ground,
- between the first control output 8 and the voltage +Vbat,
- between the second control output 10 and electrical ground,
- between the second control output 10 and the voltage +Vbat, and
- between the first control output 8 and the second control output 10.

In addition, the anomalies may also be disconnected load anomalies.

The present invention proposes, inter alia, a method for controlling the H-bridge 2 that is capable of discriminating a short circuit on at least one of the two control outputs 8, 10 of the H-bridge 2 anomaly, but also a disconnected load between the two control outputs 8 and 10 anomaly. The anomaly diagnosis will preferably be performed with the four transistors M1 to M4 of the H-bridge 2 in an open position, that is to say that the transistors M1 to M4 are in an off state.

Figure 4:
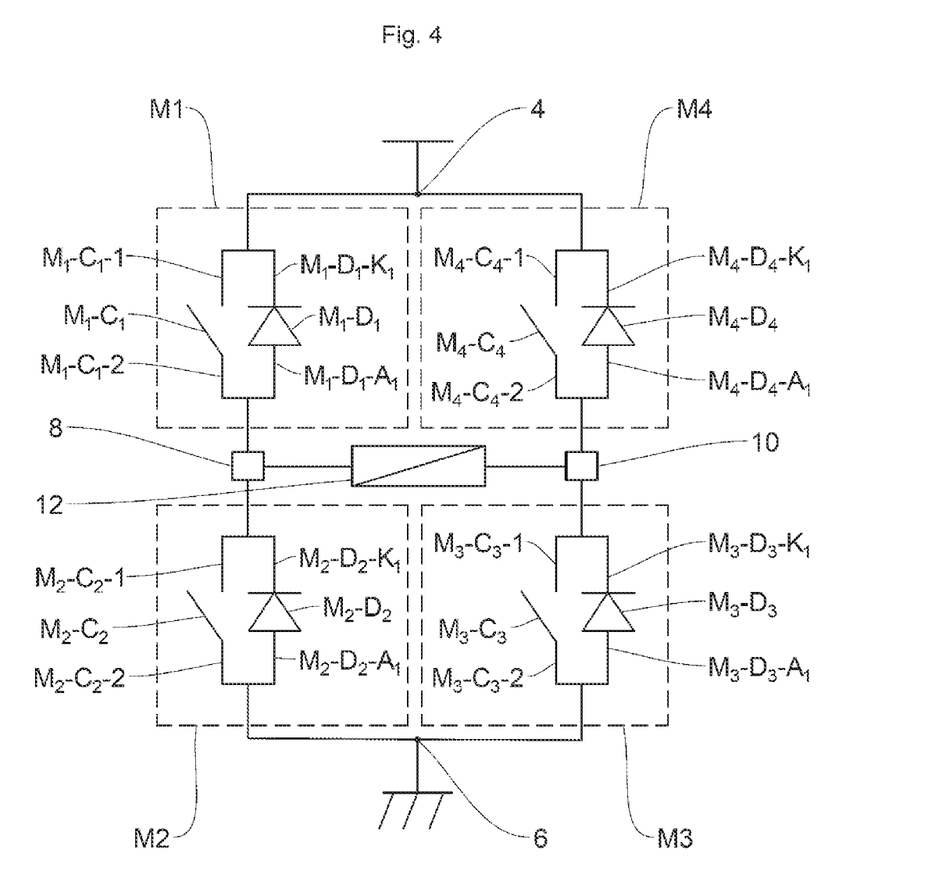
FIG. 4 is an equivalent circuit diagram of the transistors of the H-bridge in an off state.

Advantageously, in order to improve the detection of an anomaly, that is to say to significantly reduce the risk of a diagnosis error, the present invention furthermore proposes original measuring techniques for measuring electrical parameters on the H-bridge 2, as illustrated in FIG. 4. The example illustrated in FIG. 4 is a symbolic view of the H-bridge 2 and its associated connections; in no case is this view limiting with regard to the scope of the invention. In the remainder of the description, the four transistors M1 to M4 may also be called switches M1 to M4.

As mentioned above, to detect an anomaly on the H-bridge 2, the method of the invention preferably positions the four switches M1 to M4 in an off state. As those skilled in the art are aware, a transistor, for example a MOS transistor, in an off state may also be symbolized by a switch in an open position coupled in parallel to a diode that is representative of the leakage current of said MOS transistor.

The first transistor M1 is thus now represented in FIG. 4 by a first switch M1_C1, in the open position, and a first diode M1_D1. The first switch M1_C1 comprises a first terminal M1_C1_1 and a second terminal M1_C1_2. The first diode M1_D1 comprises a first cathode M1_D1_K1 and a first anode M1_D1_A1. The first terminal M1_C1_1 is coupled to the first cathode M1_D1_K1 and represents a drain of the first transistor M1. The second terminal M1_C1_2 is coupled to the first anode M1_D1_A1 and represents a source of said first transistor M1. The second transistor M2 is now represented by a second switch M2_C2, in the open position, and a second diode M2_D2. The second switch M2_C2 comprises a first terminal M2_C2_1 and a second terminal M2_C2_2. The second diode M2_D2 comprises a first cathode M2_D2_K1 and a first anode M2_D2_A1. The first terminal M2_C2_1 is coupled to the first cathode M2_D2_K1 and represents a drain of the second transistor M2. The second terminal M2_C2_2 is coupled to the first anode M2_D2_A1 and represents a source of said second transistor M2.

The third transistor M3 is now represented by a third switch M3_C3, in the open position, and a third diode M3_D3. The third switch M3_C3 comprises a first terminal M3_C3_1 and a second terminal M3_C3_2. The third diode M3_D3 comprises a first cathode M3_D3_K1 and a first anode M3_D3_A1. The first terminal M3_C3_1 is coupled to the first cathode M3_D3_K1 and represents a drain of the third transistor M3. The second terminal M3_C3_2 is coupled to the first anode M3_D3_A1 and represents a source of said third transistor M3.

Lastly, the fourth transistor M4 is represented by a fourth switch M4_C4, in the open position, and a fourth diode M4_D4. The fourth switch M4_C4 comprises a first terminal M4_C4_1 and a second terminal M4_C4_2. The fourth diode M4_D4 comprises a first cathode M4_D4_K1 and a first anode M4_D4_A1. The first terminal M4_C4_1 is coupled to the first cathode M4_D4_K1 and represents a drain of the fourth transistor M4. The second terminal M4_C4_2 is coupled to the first anode M4_D4_A1 and represents a source of said fourth transistor M4.

Figure 5:
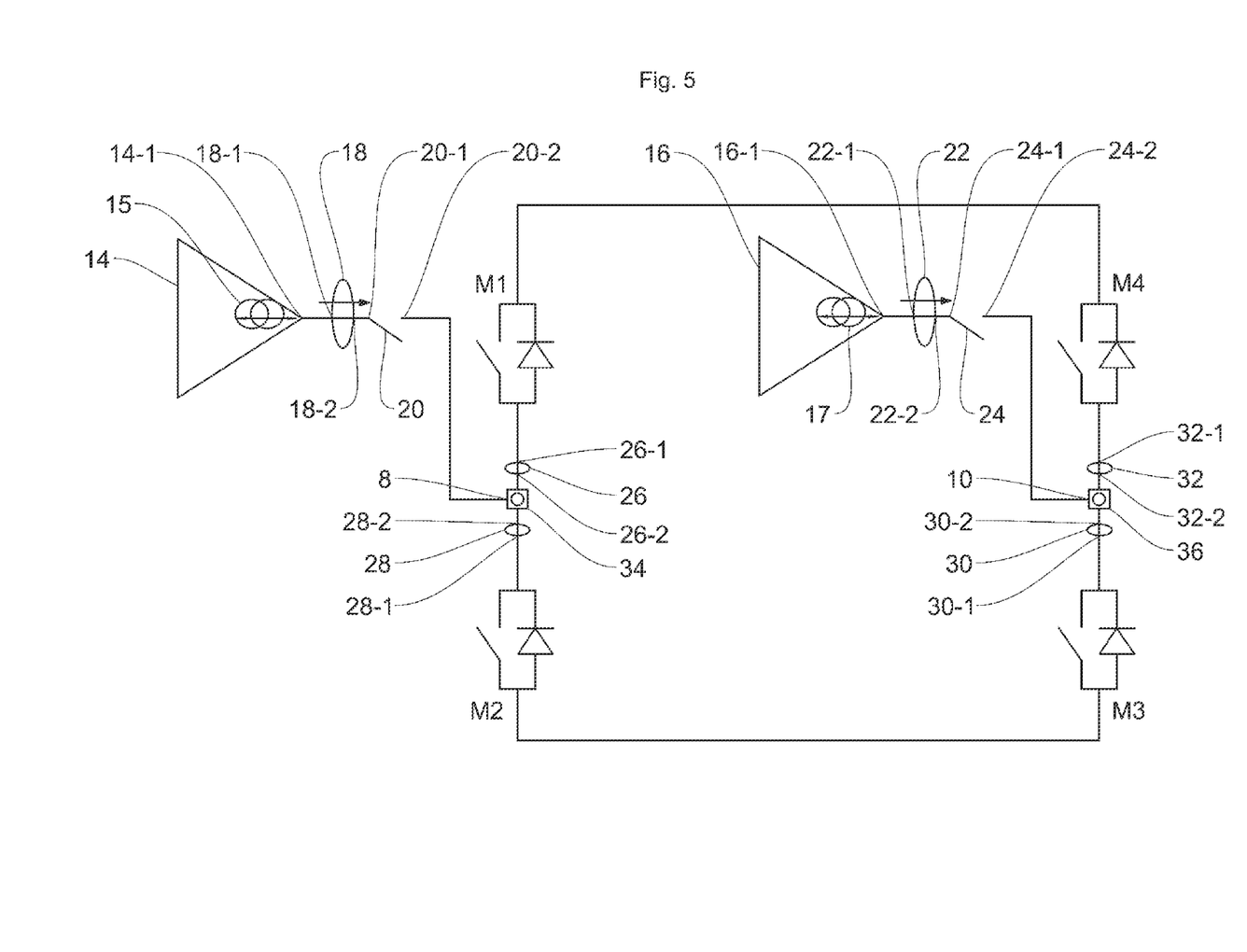
FIG. 5 is a diagram of an anomaly detection measuring device according to the present invention.
Figure 6:
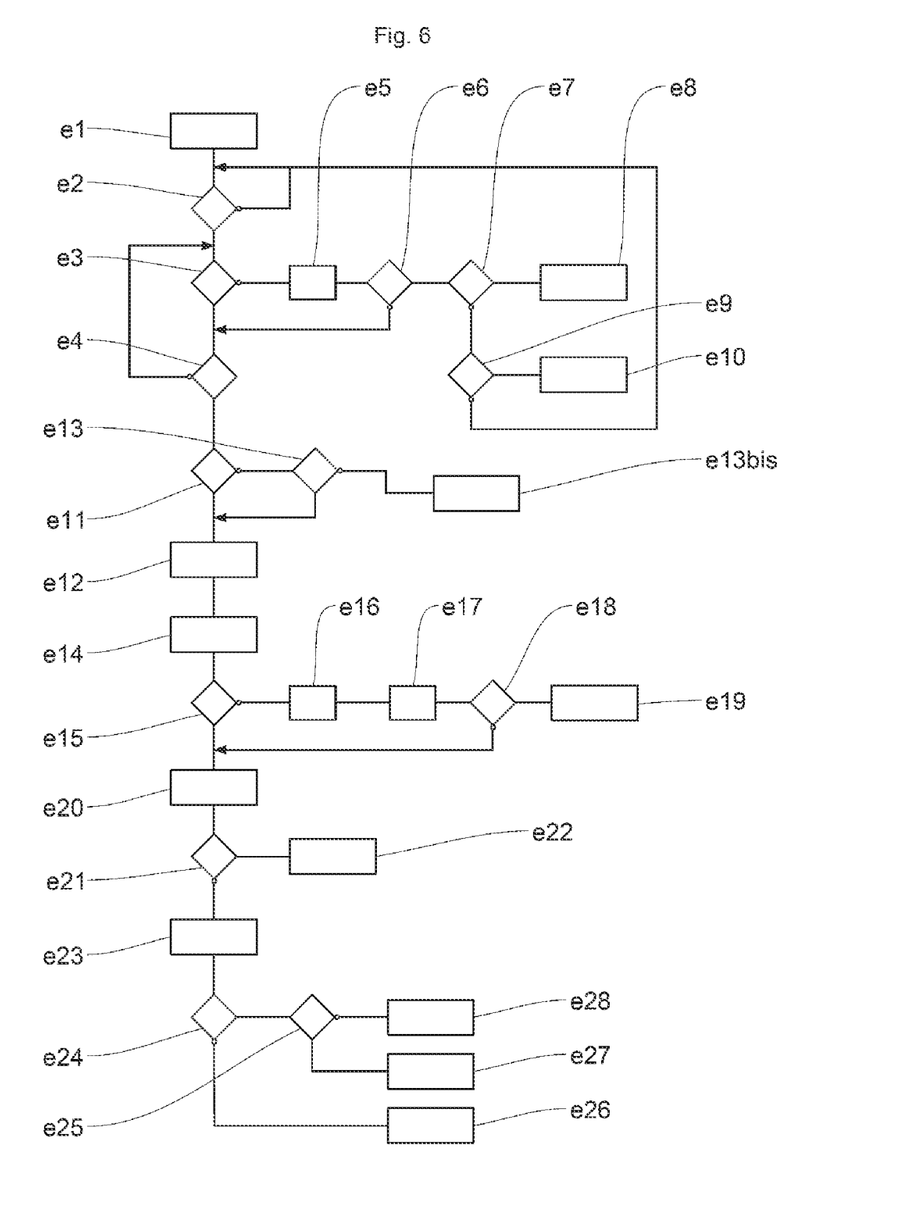
FIG. 6 is a flowchart of the method of the invention using the measuring device illustrated in FIG. 5.

FIG. 5 shows the diagram of the H-bridge 2 from FIG. 4 with measuring devices and associated connections so as to be able, using the method of the invention, illustrated in FIG. 6, to detect a short circuit or disconnected load anomaly in a manner substantially more reliable than those from the prior art. In order to simplify the diagram of FIG. 5, the inductive load 12 is not shown and is considered as a first approximation to be an open circuit.

To detect a short circuit anomaly on the H-bridge 2, the anomaly detection device according to the present invention proposes to use a first voltage generator 14 coupled to the first control output 8 and a second voltage generator 16 coupled to the second control output 10.

The first voltage generator 14 comprises a first voltage generator output 14_1 designed to deliver a controlled and modifiable DC voltage V_ref_1. In one preferred embodiment, the first voltage generator 14 also comprises a first current limiter 15. The first current limiter 15 is coupled to the first voltage generator output 14_1 and is designed to limit the current on the output 14_1 of the first voltage generator. Advantageously, limiting the current of the first voltage generator 14 makes it possible to avoid destruction of the H-bridge 2 when a short circuit to the positive power supply +Vbat is present, for example, but also to electrical ground, or even to prevent activation of the inductive load 12. Using such current limiters furthermore also makes it possible to limit the current in the load during the diagnostic phase a. In one exemplary embodiment, the first current limiter 15 is integrated into the first voltage generator 14.

The anomaly detection device furthermore comprises a first current measuring device 18. The latter comprises a first current measuring device input 18_1 coupled to the first voltage generator output 14_1 and a first current measuring device output 18_2.

A first circuit switch 20 comprising a first circuit switch input 20_1 and a first circuit switch output 20_2 is positioned between the first control output 8 and the first current measuring device output 18_2. Thus, in one exemplary embodiment and as illustrated in FIG. 5, the first circuit switch input 20_1 is coupled to the first current measuring device output 18_2, and the first circuit switch output 20_2 is coupled to the first control output 8, allowing an instantaneous measurement of the current flowing through the H-bridge 2. The second voltage generator 16 comprises a first voltage generator output 16_1 designed to deliver a controlled and modifiable DC voltage V_ref_2. Preferably, the DC voltages V_Ref1 and V_Ref_2 have similar but different values.

In one preferred embodiment, the second voltage generator 16 also comprises a second current limiter 17. The second current limiter 17 is coupled to the second voltage generator output 16_1 and is designed to limit the current thereof.

The anomaly detection device also comprises a second current measuring device 22. The latter comprises a second current measuring device input 22_1 coupled to the second voltage generator output 16_1 and a second current measuring device output 22_2.

A second circuit switch 24 comprising a second circuit switch input 24_1 and a second circuit switch output 24_2 is positioned between the second control output 10 and the second circuit switch output 24_2. Thus, in one exemplary embodiment, the second circuit switch input 24_1 is coupled to the second current measuring device output 22_2; and the second circuit switch output 24_2 is coupled to the second control output 10. In order to detect the current variation in each branch of the H-bridge 2 with relatively high accuracy, it is cleverly proposed to integrate additional measuring devices into the internal structure of the H-bridge 2.

Thus, as illustrated in FIG. 5, it is furthermore proposed to position a third current measuring device 26 between the first control output 8 and the first transistor M1. The third current measuring device 26 has a third current measuring device input 26_1 coupled both to the second terminal M1_C1_2 of the first switch M1_C1 and to the first anode M1_D1_A1 of the first diode M1_D1. It furthermore has a third current measuring device output 26_2 coupled to the first control output 8.

In one preferred embodiment, the third current measuring device is designed firstly to detect and deliver measurement information on the instantaneous current flowing in the branch of the H-bridge 2 where it is coupled, and secondly to detect and deliver information on the current variation in said same branch of the H-bridge 2.

Also, a fourth current measuring device 28 is connected between the first control output 8 and the second transistor M2. The fourth current measuring device 28 has a fourth current measuring device input 28_1 coupled both to the first terminal M2_C2_1 of the second switch M2_C2 and to the first cathode M2_D2_C1 of the second diode M2_D2. It also has a fourth current measuring device output 28_2 coupled to the first control output 8.

In one preferred embodiment, the fourth current measuring device 28 has the same technical features as those of the third current measuring device 26.

In addition, a fifth current measuring device 30 is connected between the second control output 10 and the third transistor M3. The fifth current measuring device 30 comprises a fifth current measuring device input 30_1 coupled both to the second terminal M3_C3_2 of the third switch M3_C3 and to the first anode M3_D3_A1 of the third diode M3_D3. It also has a fifth current measuring device output 30_2 coupled to the second control output 8.

Lastly, a sixth current measuring device 32 is also used and coupled between the second control output 10 and the fourth transistor M4. The sixth current measuring device 32 has a sixth current measuring device input 32_1 coupled both to the first terminal M4_C4_1 of the fourth switch M4_C4 and to the first cathode M4_D4_C1 of the fourth diode M4_D4. It has a sixth current measuring device output 30_2 coupled to the second control output 10.

The fifth current measuring device 30 and the sixth current measuring device 32 have the same technical features as for example the third current measuring device 26.

It is also proposed to position a seventh voltage measuring device 34 on the first control output 8. The seventh voltage measuring device 34 is designed firstly to measure the voltage present on the first control output 8, and secondly also to detect and measure a voltage variation on the first control output 8.

Lastly, it is proposed to position an eighth voltage measuring device 36 on the second control output 10. The eighth voltage measuring device 36 advantageously has the same technical features as the seventh voltage measuring device 34.

In one exemplary embodiment, the abovementioned voltage and/or current measuring devices are devices external to the circuit of the H-bridge 2.

In another exemplary embodiment, the abovementioned voltage and/or current measuring devices are integrated partially (some of the measuring devices) into the circuit of the H-bridge 2. As an additional variant, they may be integrated fully into the circuit of the H-bridge 2.

The method for detecting at least one anomaly according to the present invention will now be presented. The steps of the method according to the present invention are shown on the flowchart in FIG. 6.

The method according to the present invention thus comprises a first step e1, during which the first transistor M1, the second transistor M2, the third transistor M3 and the fourth transistor M4 are put into an off state. The transistors are put into an off state for example by setting the first analog signal S1, the second analog signal S2, the third analog signal S3 and the fourth analog signal S4 to "0". Of course, those skilled in the art will understand the concept of the off state of a transistor to mean putting it into an open state.

In a second step e2, a step of verifying the state of the transistors M1 to M4 is performed. If the four transistors M1 to M4 are indeed respectively in an off state, then a third step e3 is performed. If at least one of the four transistors is not yet in an off state, then the second step e2 is executed again.

The third step e3 of the method of the present invention consists of a test for the presence or absence of a current flowing through the first control output 8 and/or the second control output 10 without using a voltage and/or current source external to the H-bridge 2. Specifically, as those skilled in the art are aware, even if the transistors M1 to M4 are in an off state, it is possible for a current to flow through the internal diodes of the transistors M1 to M4, which may be synonymous with an anomaly.

Thus, in one exemplary embodiment of the method of the invention, during this third step e3, the third current measuring device 26 is activated and interrogated by a control device, such as for example an electronic computer, in order to verify the presence or the absence of a reverse current flowing through the first transistor M1 and more precisely through its internal diode D1.

If no current is detected by the third current measuring device 26, which is synonymous with no anomaly being detected on the first transistor M1, then a fourth step e4 is executed. If a current is detected by the third current measuring device 26, then the method of the invention makes provision to move to a fifth step e5.

The fourth step e4 consists in verifying whether all of the transistors of the H-bridge 2 have been tested. If all of the transistors have been tested, then an eleventh step e11 is executed. If not (there is still at least one transistor of the H-bridge 2 to be tested), then the third step e3 is executed again on the transistor of the H-bridge 2 to be tested. Of course, the measuring devices linked to the transistor to be tested during the third step e3 will be activated accordingly. During the fifth step e5, which is synonymous according to the invention with the possible detection of a current flowing in at least one of the transistors of the H-bridge 2, a first time counter is activated. In one exemplary embodiment of the method of the invention, said first time counter is programmable and has for example a duration of 10 ms (10 ms=0.01 s). This duration may for example correspond to the nominal discharge duration of the inductive load 12. Once the duration of 10 ms has passed, the method of the invention makes provision to move to a sixth step e6.

During the sixth step e6, a new measurement of the presence of a current flowing through said transistor, under test in the third step e3, of the H-bridge 2 is performed again. Advantageously, the actions performed here are identical to those presented in the third step e3. The method cleverly makes provision to move to the fourth step e4 if no current is detected in said transistor under test of the H-bridge 2. Furthermore, if a current is detected in said transistor under test, then the method of the invention makes provision to move to a seventh step e10, synonymous with the presence of at least one anomaly at the H-bridge 2.

During the seventh step e10, the current measuring devices are activated again. Cleverly, firstly the measurement of a current through the first transistor M1 and then through the fourth transistor M4 is tested, making it possible to detect the presence of a short circuit to a voltage greater than the positive voltage +Vbat anomaly, which is able to occur only on the first transistor M1 and the fourth transistor M4, which are also called high-side transistors by those skilled in the art.

Thus, for example, the third current measuring device 26 is first of all activated and interrogated in order to detect the presence of a current through the first transistor M1. If a current is detected by the third current measuring device 26, this is synonymous, according to the method of the invention, with the presence of a short circuit to a voltage greater than the positive voltage +Vbat on the first control output 8 anomaly. In this case, the method according to the present invention makes provision to move to an eighth step e8.

If no current is detected through the first transistor M1, the third current measuring device 26 is deactivated and the sixth current measuring device 32 is in turn activated in order to detect the presence of a potential current in the fourth transistor M4.

If a current is detected by the sixth current measuring device 32, this is synonymous, according to the method of the present invention, with the presence of a short circuit to a voltage greater than the positive voltage +Vbat on the second control output 10 anomaly. In this case, the method according to the present invention makes provision to move to the eighth step e8. If no current is detected through the fourth transistor M4, the sixth current measuring device 32 is deactivated and the method makes provision to move to a ninth step e9.

The eighth step e8 advantageously makes provision to save the information on the anomaly observed in the seventh step e7. For example, during the eighth step e8, the engine control computer is informed of the presence of a short circuit to the positive voltage greater than +Vbat anomaly by a dedicated memory cell being set to "1". Those skilled in the art will clearly understand that this example is given by way of illustration and is in no way limiting with regard to the scope of the invention.

As a variant, the method of the invention, after the eighth step e8, once the engine control computer has been informed of the proven anomaly, may for example position the H-bridge 2 in a protection mode.

The ninth step e9 consists in activating the other current measuring devices. Cleverly, firstly the measurement of a current through the second transistor M2 and then through the third transistor M3 is tested, in order to detect the presence of a short circuit to electrical ground anomaly, which is able to occur only on the second transistor M2 and/or the third transistor M3, which are also called low-side transistors by those skilled in the art.

Thus, for example, the fourth current measuring device 28 is first of all activated and interrogated in order to detect the presence of a current through the second transistor M2. If a current is detected by the fourth current measuring device 28, this is synonymous, according to the method of the invention, with a short circuit to a potential lower than electrical ground on the first control output 8. In this case, the method according to the present invention makes provision to move to a tenth step e10.

If no current is detected through the second transistor M2, the fourth current measuring device 28 is deactivated and the fifth current measuring device 30 is in turn activated in order to detect the presence of a potential current in the third transistor M3. If a current is detected by the fifth current measuring device 30, this is synonymous, according to the method of the invention, with a short circuit to a potential lower than electrical ground on the second control output 10.

In this case, the method according to the present invention makes provision to move to the tenth step e10.

If no current is detected, then the method of the invention again moves to the second step e2.

The tenth step e10 advantageously makes provision to save the information on the anomaly observed in the ninth step e9. For example, during the tenth step e10, the engine control computer is informed of the presence of a short circuit to a potential lower than electrical ground anomaly by a dedicated memory cell being set to "1". The method furthermore makes provision, during this tenth step e10, once the engine control computer has been informed of the proven anomaly, to exit the method of the invention and for the H-bridge 2 to again be controlled in a normal operating mode.

By virtue of using the first time counter and the measurement of the current in each transistor before and after a determined duration, the risk of a diagnosis error is substantially reduced.

The method of the invention furthermore proposes to detect the presence of an electromotive force at the terminals of the first control output 8 and of the second control output 10; representative for example of a rotation resulting from the inductive load 12.

After verifying the presence of a short-circuit current in the H-bridge 2, the method makes provision, in an eleventh step e11, to sequentially or simultaneously activate the seventh voltage measuring device 34 and the eighth voltage measuring device 36 in order to record the voltage on the first control terminal 8 and on the second control voltage terminal 10. Once the two measurements have been performed, it is proposed in this eleventh step e11 to subtract the absolute values of the two recorded voltages. Thus, for example, the value of the voltage recorded on the first control voltage terminal 8 is subtracted from the value of the voltage recorded on the second control voltage terminal 10.

The method of the present invention makes provision, when the result of the subtraction is nil, that is to say equal to zero, to move to a twelfth step e12. Advantageously, this result of the comparison of the two voltages means that there is no electromotive force present on the two control outputs of the H-bridge 2 and that the inductive load 12 is therefore stationary.

If the result of said subtraction is not zero, then the method moves to a thirteenth step e13; according to the present invention, this means that a resulting electromotive force is present on the control outputs of the H-bridge 2.

In order to ensure that the electromotive force is stopped, corresponding to stoppage of the electric motor, it is cleverly proposed, in the thirteenth step e13, to apply a time delay using a second time counter, which is set for example to a value of 1 s. Once the time of 1 s has elapsed, if no electromotive force is detected, then the method according to the invention proposes to move to the twelfth step e12, otherwise an electromotive force anomaly alert is for example saved in a dedicated memory in a step e13 bis).

Thus, by virtue of the method of the invention, it is possible to avoid potential detection of an anomaly that has not been proven on at least one control output terminal of the H-bridge 2 that is caused by the presence of an electromotive force present on said control output terminals 8 and 10.

Advantageously, it is now possible to make an improved diagnosis of the presence of at least one anomaly on at least one of the transistors of the H-bridge 2. Specifically, the state of the four transistors is known and fixed, as is the absence of an electromotive force on at least one of the control output terminals of the H-bridge 2.

In the twelfth step e12 of the method of the invention, the first voltage generator 14 and the second voltage generator 16 are now activated. In order for the first voltage V_ref_1 delivered by the first voltage generator output 14_1 to be applied to the first control output terminal 8 of the H-bridge 2, the first circuit switch 20 is activated, for example in one embodiment of the invention.

Likewise, with regard to the application of the second reference voltage V_ref_2, the second voltage generator 16 is activated during this same twelfth step e12. In order for the second reference voltage V_ref_2 to be applied to the second control terminal 10, the second circuit switch 24 is activated. Once the voltage sources have been activated and the voltages have been applied to the two output terminals of the H-bridge 2, a fourteenth step e14 is executed.

In this fourteenth step e14, a variation in the voltage V_out_1 at the first control terminal 8 is measured using the seventh voltage measuring device 34. To measure the variation in the voltage V_out_1, for example, a first measurement of the voltage V_out_1 is performed and is stored in a dedicated memory space, and then, after a settable and determined duration, for example 100 µs, a second measurement of the voltage V_out_1 is performed. The two values are compared and a slope is deduced therefrom through a mathematical calculation that is known to those skilled in the art.

In another variant embodiment of the method, the seventh voltage measuring device 34 automatically performs and determines the measurement of the slope of the voltage V_out_1. Those skilled in the art are well aware of these automated measuring techniques.

During this fourteenth step e14, the slope of the output voltage V_out_2 is also measured. In one exemplary embodiment, the same measuring technique as the one for the first output voltage V_out_1 is used. Furthermore, for example, the time gaps between two measurements of the output voltages are identical. In one exemplary embodiment, the output voltages are measured simultaneously.

Once the two slopes have been deduced and/or measured, the method makes provision to move to a fifteenth step e15.

In the fifteenth step e15, if at least one of the two slopes is non-zero, then the method makes provision to execute a sixteenth step e16, and if the two slopes are zero, then the method makes provision to execute a twentieth step e20.

During this sixteenth step e16, a third time counter is activated. The duration may be settable and has for example a value of 10 ms. Once the duration has elapsed, the method moves to a seventeenth step e17.

During this seventeenth step e17, the same measurements as in the fourteenth step e14 are performed in order to collect a second slope of the first output voltage V_out_1 and of the second output voltage V_out_2. The method then makes provision to move to an eighteenth step e18.

The eighteenth step e18 consists in comparing the two slopes of the output voltages V_out_1 and V_out_2, and the result is for example stored in a memory. If at least one of the two results of comparing the slopes of the first output voltage V_out_1 or of the second output voltage V_out_2 is non-zero (which means a voltage variation), then the method makes provision to move to a nineteenth step e19. If no variation is observed, then the method makes provision to move to the twentieth step e20.

The nineteenth step e19 consists in generating a frequency interference alert at the engine control computer, for example. Specifically, in this case, according to the method of the invention, an anomaly, for example electromagnetic coupling to one of the two outputs at the H-bridge 2, is present. In one exemplary embodiment, the method of the invention then makes provision, after the nineteenth step e19, to end the execution of the method of the invention and therefore for example to control the H-bridge 2 normally.

In the twentieth step e20, the first current measuring device 18 is activated and the current flowing through it, for example called I_out_1, is measured. The recorded value is for example stored in a memory dedicated for this purpose. Likewise, during this twentieth step e20, the second current measuring device 20 is activated and the current I_out_2 flowing through it is measured. The recorded value I_out_2 is itself also stored in a dedicated memory.

Cleverly, during a twenty-first step e21, the two current values I_out_1 and I_out_2 are then compared. This comparison may be performed by a computer.

When the result of the comparison between the values I_out_1 and I_out_2 is almost identical or for example within a difference of a value of the order of 2% of the absolute value of the current I_out_1, then, according to the method of the invention, this means that there is no anomaly observed at the H-bridge 2, and that, accordingly, the H-bridge 2 is in a normal operating state. The method of the invention thus makes provision, in this scenario, to move to a twenty-second step e22.

Cleverly, there is provision for the values of the two output currents to be substantially different due to the connections and the components that are coupled to the first control output 8 and to the second control output 10. This variation may stem from a resistor coupled to a single control output, and which therefore causes a variation in the output currents. In addition, capacitors may also be coupled to at least one output, such as for example a filtering capacitor. This capacitor may thus also create interference at at least one control output of the H-bridge 2. Advantageously, by virtue of this tolerance with regard to the values of the output current, it is possible, unlike the prior art, to avoid potential errors in the diagnosis.

If the two output current values are outside the desired measurement range, for example 2% of the absolute value of the current I_out_1, then the method makes provision to move to a twenty-third step e23.

During the twenty-second step e22, the method of the invention makes provision for example to generate a message to the microcontroller about the correct operation of the H-bridge 2, synonymous with no short circuit or open circuit anomaly.

During the twenty-third step e23, the values of the output voltages V_out_1 and V_out_2 are recorded by the seventh voltage measuring device 34 and by the eighth voltage measuring device 36.

During a twenty-fourth step e24, the two values are compared. The method makes provision to move to a twenty-fifth step e25 if the comparison result is within a difference between +/−2% of the absolute value of a measurement of an output voltage, for example V_out_1, and if the result of the comparison is greater, the method makes provision to move to a twenty-sixth step e26.

During the twenty-fifth step e25, the value of the output voltage V_out_1 and of the reference voltage Vref1 are compared. If the first measured output voltage V_out_1 is greater than the reference voltage V_ref1 and than the reference voltage V_ref2, then the method moves to a twenty-seventh step e27. If the first output voltage V_out_1 is lower than the reference voltage V_ref1 and than the reference voltage V_ref2, then the method moves to a twenty-eighth step e28.

During the twenty-seventh step e27, an alert is generated to the engine control computer stipulating that an anomaly is detected and is a battery short circuit anomaly. The method of the invention is then for example stopped and the H-bridge 2 may again be controlled by the engine control computer for example.

During the twenty-eighth step e28, an alert is advantageously generated to the engine control computer, for example mentioning that a short circuit to electrical ground anomaly is observed at the H-bridge 2. The method of the invention is then for example stopped and the H-bridge 2 may for example be controlled again.

During the twenty-sixth step e26, an alert is generated to the engine control computer stipulating that an anomaly is detected and is a disconnected load or open circuit at the two control outputs 8, 10 anomaly. The method of the invention then furthermore makes provision to end the execution of the method of the invention and therefore for example to control the H-bridge 2 normally.

The present invention thus proposes a device and a method for detecting an anomaly in an H-bridge control circuit that make it possible to improve the reliability of the detection of short circuit and open circuit anomalies.

Advantageously, the method of the present invention makes it possible to identify the origin of a short circuit or of an open circuit in the structure of the H-bridge, but also at the load controlled by said H-bridge. The method of the invention furthermore also makes it possible to measure the electromotive force of the controlled load and makes it possible to detect new fault cases in comparison with the prior art.

Furthermore, the method of the present invention has a significantly faster execution time than that from the prior art.

Of course, the present invention is not limited to the preferred embodiment described above and illustrated in the drawing and to the variant embodiments mentioned, but extends to all variants within the scope of those skilled in the art.

The invention claimed is:

1. A device for supplying power to an inductive load, the device comprising:
    an H-bridge switching structure coupled to a positive power supply and an electrical ground, the H-bridge switching structure comprising a first switch, a second switch, a third switch, and a fourth switch that are distributed over two branches of the H-bridge, the switching structure being configured to drive a current in the inductive load through a first control output and a second control output; and
    an anomaly detector configured to generate at least one item of anomaly detection information about detection of an anomaly at the H-bridge switching structure, the anomaly detector comprising:
        a first voltage generator controlled and configured to deliver a first reference voltage,
        a second voltage generator controlled and configured to deliver a second reference voltage, said first and second voltage generators being coupled respectively to the first control output and the second control output, the value of the first reference voltage being greater than the value of the second reference voltage,
        a first current measuring device configured to measure a current at the output of the first voltage generator, a second current measuring device configured to measure a current at an output of the second voltage generator,
a third current measuring device coupled between the first switch and the first control output,
a fourth current measuring device coupled between the second switch and the first control output,
a fifth current measuring device coupled between the third switch and the second control output,
a sixth current measuring device coupled between the fourth switch and the second control output,
the current measuring devices being configured to respectively measure the currents flowing through said switches,
a seventh voltage measuring device coupled to the first control output, and
an eighth voltage measuring device coupled to the second control output,
said seventh and eighth voltage measuring devices being configured to measure voltages on the control outputs.

2. The device for supplying power to the inductive load as claimed in claim 1, wherein the anomaly detector further comprises:
a first circuit switch coupled between the first voltage generator and the first control output, and
a second circuit switch coupled between the second voltage generator and the second control output, the first circuit switch and the second circuit switch being configured to electrically isolate the structure of the H-bridge.

3. The device for supplying power to the inductive load as claimed in claim 1, wherein the first current measuring device, the second current measuring device, the third current measuring device, the fourth current measuring device, the fifth current measuring device, and the sixth current measuring device are configured to take instantaneous measurements of current differences over time.

4. The device for supplying power to the inductive load as claimed in claim 2, wherein the first current measuring device, the second current measuring device, the third current measuring device, the fourth current measuring device, the fifth current measuring device, and the sixth current measuring device are configured to take instantaneous measurements of current differences.

5. A method for supplying power to an inductive load including
an H-bridge switching structure coupled to a positive power supply and an electrical ground, the H-bridge switching structure including a first switch, a second switch, a third switch, and a fourth switch that are distributed over two branches of the H-bridge, the switching structure being configured to drive a current in the inductive load through a first control output and a second control output, and
an anomaly detector configured to generate at least one item of anomaly detection information about detection of an anomaly at the H-bridge switching structure, the anomaly detector including
a first voltage generator controlled and configured to deliver a first reference voltage,
a second voltage generator controlled and configured to deliver a second reference voltage, said first and second voltage generators being coupled respectively to the first control output and the second control output, the value of the first reference voltage being greater than the value of the second reference voltage,
a first current measuring device configured to measure a current at the output of the first voltage generator,
a second current measuring device configured to measure a current at an output of the second voltage generator,
a third current measuring device coupled between the first switch and the first control output,
a fourth current measuring device coupled between the second switch and the first control output,
a fifth current measuring device coupled between the third switch and the second control output,
a sixth current measuring device coupled between the fourth switch and the second control output,
the current measuring devices being configured to respectively measure the currents flowing through said switches,
a seventh voltage measuring device coupled to the first control output, and
an eighth voltage measuring device coupled to the second control output,
said seventh and eighth voltage measuring devices being configured to measure voltages on the control outputs,
the method comprising:
e1) positioning the first, second, third, and fourth switches of the H bridge switching structure in an off state;
e2) verifying and awaiting the off state of all of the first, second, third, and fourth switches;
e3) sequentially measuring a current flowing through each of the first, second, third, and fourth switches, and
(i) when there is no current flowing through all of the first, second, third, and fourth switches, then moving to step e11),
(ii) when there is at least one current flowing through at least one of the first, second, third, and fourth switches, awaiting a first determined duration before performing a new measurement of the current flowing through each of the first, second, third, and fourth switches and then, when there is at least one current in at least one of the first, second, third, and fourth switches, then identifying whether one of the first and third switches coupled to the positive power supply is being flowed through by said measured current,
(a) when one of said first and third switches is being flowed through by said current, moving to step e8), and
(b) when neither of said two switches is being flowed through by a current, then identifying whether one of the two switches coupled to electrical ground is being flowed through by said measured current, and when one of said two switches is being flowed through by said current, moving to step e10);
e8) confirming the presence of a short circuit to a voltage level higher than the battery anomaly at at least one of the two high-side switches;
e10) confirming the presence of a short circuit to a voltage level lower than ground anomaly at at least one of the two low-side switches;
e11) detecting the presence of an electromotive force between the first control output and the second control output by measuring the voltages on the first control output and the second control output, and (i) when the measured voltages are equal, moving to step e12), and
(ii) when the measured voltages are different, then recording the difference between the first control output and the second control output corresponding to the electromotive force to control the connected load,
awaiting a second determined duration before subsequently measuring the voltages on the first control output and the second control output, and
when the subsequently measured voltages have equal values, then moving to step e12), otherwise implementing an alert and stopping the execution of the method;

e12) coupling a first voltage generator and a second voltage generator to said control outputs, and then respectively applying a first voltage and a second voltage;

e14) measuring the voltages on the first control output and the second control output, and
(i) when the measured voltage variations over time are outside a first measurement range, moving to step e16), and
(ii) when the measured voltage variations are within the first measurement range, and then moving to step e20);

e16) awaiting a third determined time before measuring the voltages on the first control output and the second control output again, and
(i) when the measured voltage variations are again outside the first measurement range, then declaring a frequency interference anomaly, and
(ii) when the measured voltage variations are within the first measurement range, moving to step e20);

e20) measuring the currents flowing through the first control output and the second control output, and
(i) when the difference between the two measured currents is within a second measurement range, then stopping the anomaly test and declaring no short circuit or open circuit anomaly, and
(ii) when the difference between the two measured currents is not within the second measurement range, then moving to step e23);

e23) measuring the voltages of the two outputs, and
(i) when the voltage measured on the first control output is different from the voltage measured on the second control output, then the detected anomaly is determined to be an open load anomaly, and stopping the execution of the method, and
(ii) when the voltage measured on the first control output is not different from the voltage measured on the second control output, moving to step e25); and e25) measuring the voltages on the first control output and the second control output, and
(i) when the measured voltages are greater than the voltages generated by the voltage generators connected to the outputs, then generating an alert regarding the presence of a short circuit to the positive voltage anomaly, and
(ii) when the measured voltages are lower than the voltages generated by the voltage generators connected to the outputs, then generating an alert regarding the presence of a short circuit to electrical ground anomaly.

6. The method for supplying power to the inductive load as claimed in claim 5, wherein the first determined duration is equal to 1 ms.

7. The method for supplying power to the inductive load as claimed in claim 5, wherein the second determined duration is equal to 100 ms.

8. The method for supplying power to the inductive load as claimed in claim 5, wherein the first measurement range is of the order of 2% of the voltage measured on the first control output.

9. The method for supplying power to the inductive load as claimed in claim 5, wherein the second measurement range is of the order of 2% of the current flowing through the inductive load.

10. The method for supplying power to the inductive load as claimed in claim 6, wherein the second determined duration is equal to 100 ms.

11. The method for supplying power to the inductive load as claimed in claim 6, wherein the first measurement range is of the order of 2% of the voltage measured on the first control output.

12. The method for supplying power to the inductive load as claimed in claim 7, wherein the first measurement range is of the order of 2% of the voltage measured on the first control output.

13. The method for supplying power to the inductive load as claimed in claim 6, wherein the second measurement range is of the order of 2% of the current flowing through the inductive load.

14. The method for supplying power to the inductive load as claimed in claim 7, wherein the second measurement range is of the order of 2% of the current flowing through the inductive load.

15. The method for supplying power to the inductive load as claimed in claim 8, wherein the second measurement range is of the order of 2% of the current flowing through the inductive load.

* * * * *